US009606446B2

(12) United States Patent
Wabra et al.

(10) Patent No.: US 9,606,446 B2
(45) Date of Patent: Mar. 28, 2017

(54) REFLECTIVE OPTICAL ELEMENT FOR EUV LITHOGRAPHY AND METHOD OF MANUFACTURING A REFLECTIVE OPTICAL ELEMENT

(71) Applicant: Carl Zeiss SMT GmbH, Oberkochen (DE)

(72) Inventors: Norbert Wabra, Werneck (DE); Boris Bittner, Roth (DE); Martin Von Hodenberg, Oberkochen (DE); Hartmut Enkisch, Aalen (DE); Stephan Muellender, Aalen (DE); Olaf Conradi, Westhausen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 103 days.

(21) Appl. No.: 14/732,248

(22) Filed: Jun. 5, 2015

(65) Prior Publication Data

US 2015/0316851 A1    Nov. 5, 2015

Related U.S. Application Data

(63) Continuation of application No. PCT/EP2013/075620, filed on Dec. 5, 2013.
(Continued)

(30) Foreign Application Priority Data

Dec. 6, 2012 (DE) .................. 10 2012 222 466

(51) Int. Cl.
*G03F 1/22* (2012.01)
*G03F 1/24* (2012.01)
(Continued)

(52) U.S. Cl.
CPC .............. *G03F 7/702* (2013.01); *B82Y 10/00* (2013.01); *G02B 5/0816* (2013.01);
(Continued)

(58) Field of Classification Search
CPC ...................................... G03F 1/24; G03F 1/22
(Continued)

(56) References Cited

U.S. PATENT DOCUMENTS 7,060,993 B2   6/2006  Wedowski et al.
7,294,438 B2   11/2007 Shoki
(Continued)

FOREIGN PATENT DOCUMENTS

DE          10209493 A1    10/2003
DE       102004013459 A1    11/2004
(Continued)

OTHER PUBLICATIONS

International Search Report in counterpart International Application No. PCT/EP2013/075620, mailed Apr. 9, 2014.
(Continued)

*Primary Examiner* — Stephen Rosasco
(74) *Attorney, Agent, or Firm* — Edell, Shapiro & Finnan, LLC

(57) ABSTRACT

A reflective optical element of an optical system for EUV lithography and an associated manufacturing method. The reflective optical element (20) includes a multilayer system (23, 83) for reflecting an incident electromagnetic wave having an operating wavelength in the EUV range, the reflected wave having a phase φ, and a capping layer (25, 85) made from a capping layer material. The method includes determining a dependency according to which the phase of the reflected wave varies with the thickness d of the capping layer, determining a linearity-region in the dependency in which the phase of the reflected wave varies substantially
(Continued)

linearly with the thickness of the capping layer, and creating a thickness profile in the capping layer such that both the maximum thickness and the minimum thickness in the thickness profile are in the linearity-region.

18 Claims, 7 Drawing Sheets

Related U.S. Application Data

(60) Provisional application No. 61/734,183, filed on Dec. 6, 2012.

(51) Int. Cl.

| | | |
|---|---|---|
| *G03F 7/20* | (2006.01) | |
| *G02B 5/08* | (2006.01) | |
| *G21K 1/06* | (2006.01) | |
| *G02B 17/06* | (2006.01) | |
| *G02B 27/10* | (2006.01) | |
| *B82Y 10/00* | (2011.01) | |

(52) U.S. Cl.
CPC ....... *G02B 5/0891* (2013.01); *G02B 17/0663* (2013.01); *G02B 27/1033* (2013.01); *G03F 7/70308* (2013.01); *G03F 7/70316* (2013.01); *G03F 7/70916* (2013.01); *G03F 7/70958* (2013.01); *G21K 1/062* (2013.01)

(58) Field of Classification Search
USPC .............................................. 430/5
See application file for complete search history.

(56) References Cited

U.S. PATENT DOCUMENTS

| | | |
|---|---|---|
| 8,486,590 B2 | 7/2013 | Kamenov et al. |
| 2008/0165415 A1 | 7/2008 | Chan et al. |
| 2010/0195075 A1 | 8/2010 | Chan et al. |
| 2012/0196208 A1 | 8/2012 | Mikami et al. |
| 2013/0286471 A1 | 10/2013 | Freimann et al. |

FOREIGN PATENT DOCUMENTS

| | | |
|---|---|---|
| DE | 102009054986 A1 | 6/2011 |
| DE | 102010041502 A1 | 3/2012 |
| DE | 102012222451 A1 | 6/2014 |
| EP | 1291680 A2 | 3/2003 |
| EP | 1930771 A1 | 6/2008 |
| EP | 2053463 A1 | 4/2009 |

OTHER PUBLICATIONS

Written Opinion in counterpart International Application No. PCT/EP2013/075620, mailed Apr. 9, 2014.
International Preliminary Report on Patentability in counterpart International Application No. PCT/EP2013/075620, dated Jun. 18, 2015.
Office Action in corresponding German Application No. 102012222466.1, dated May 13, 2013, along with an English translation.

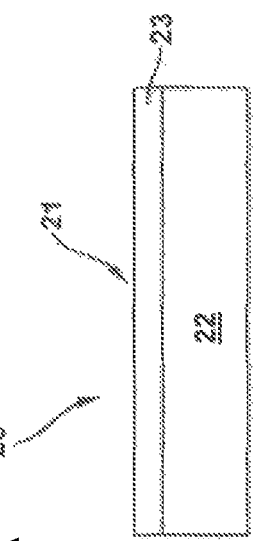
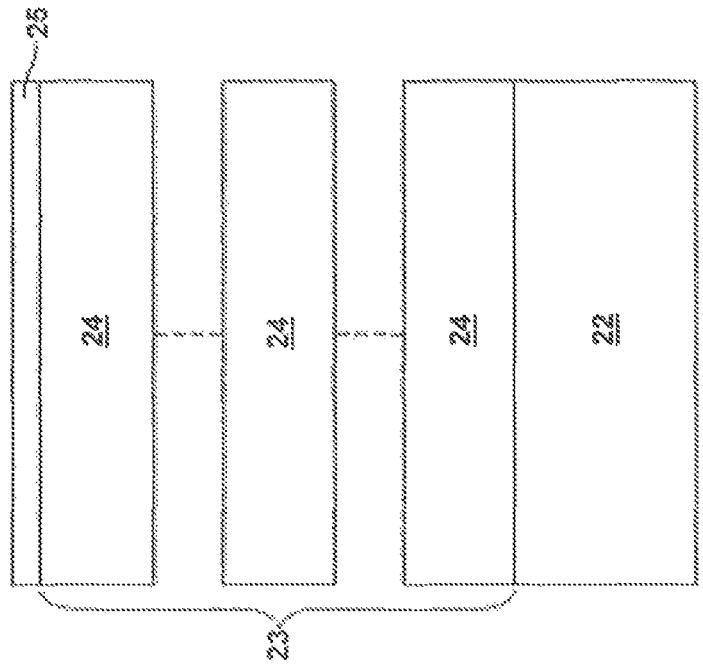
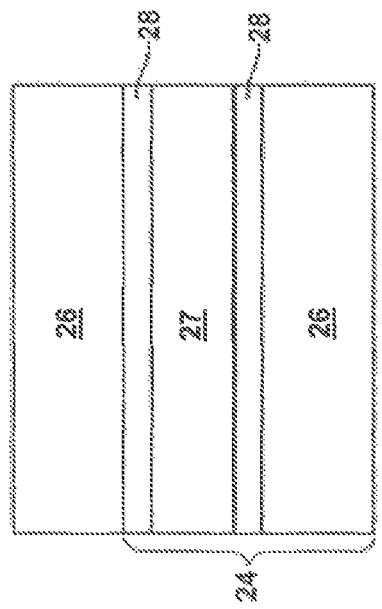

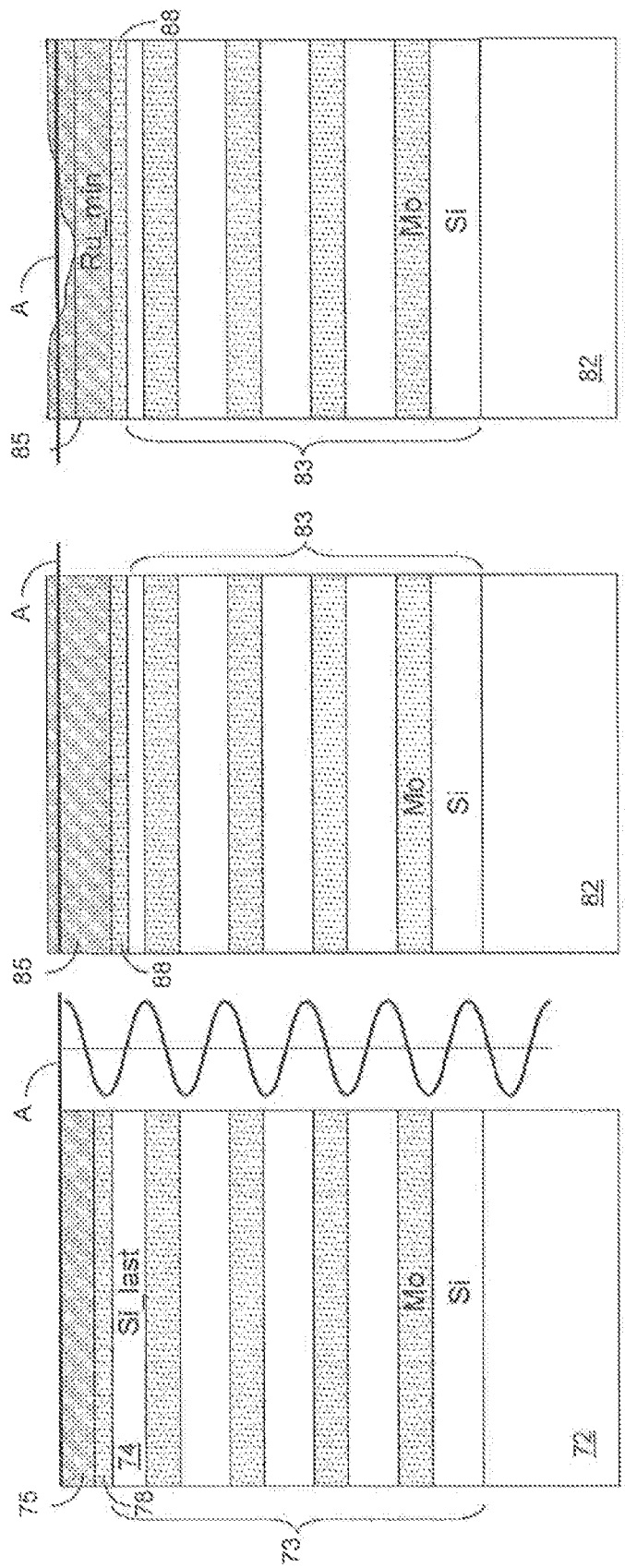

REFLECTIVE OPTICAL ELEMENT FOR EUV LITHOGRAPHY AND METHOD OF MANUFACTURING A REFLECTIVE OPTICAL ELEMENT

CROSS REFERENCE TO RELATED APPLICATIONS

This application is a Continuation of International Application No. PCT/EP2013/075620, filed on Dec. 5, 2013, which claims benefit under 35 U.S.C. §119(e) to U.S. Provisional Application No. 61/734,183, filed Dec. 6, 2012, and which claims priority under 35 U.S.C. §119(a) to German Patent Application No. 10 2012 222 466.1, also filed on Dec. 6, 2012. The disclosures of all three related applications are considered part of and are incorporated by reference into the disclosure of the present application in their respective entireties.

FIELD OF THE INVENTION

The invention relates to a reflective optical element of an optical system for EUV lithography as well as to a method of manufacturing a reflective optical element of an optical system for EUV lithography.

BACKGROUND

Microlithography is used for producing microstructured components, such as, for example, integrated circuits or LCDs. The microlithography process is carried out in a so-called projection exposure apparatus comprising an illumination device and a projection lens. In this case, the image of a mask (=reticle) illuminated by the illumination device is projected, by the projection lens, onto a substrate (e.g. a silicon wafer) coated with a light-sensitive layer (photoresist) and arranged in the image plane of the projection lens, in order to transfer the mask structure to the light-sensitive coating of the substrate.

In order to be able to produce ever finer structures within the scope of producing semiconductor components with lithographic methods, work is undertaken with light having ever shorter wavelengths. If work is undertaken in the extreme ultraviolet (EUV) wavelength range, for example with wavelengths between approximately 5 nm and 20 nm in particular, it is no longer possible to work in transmission with lens-like elements. Rather, illumination lenses or projection lenses or else masks made of reflective optical elements with reflection coatings matched to the respective operating wavelength are designed on the basis of multilayer systems. In the ultraviolet wavelength range it is also possible to work using reflective optical elements on the basis of multilayer systems.

Multilayer systems are alternately applied sub-layers of a material with a higher real part of the refractive index at the operating wavelength (also referred to as a spacer) and a material with a lower real part of the refractive index at the operating wavelength (also referred to as an absorber), with an absorber/spacer pair forming a stack with a specific period thickness, with the period thickness equaling the sum of the thicknesses of the individual sub-layers forming a stack. As a result of the repeated arrangement of stacks with an absorber/spacer pair, a crystal is simulated in a certain way, the lattice planes of which correspond to the absorber sub-layers at which Bragg reflection occurs. In the case of more complex multilayer systems, a stack can have one or more additional sub-layers in addition to the absorber sub-layer and the spacer sub-layer. By way of example, these additional sub-layers can be employed to avoid chemical mixing between the absorber and spacer material, or else to create a stack which is particularly stable against thermal influences (for example when heating the mirror by light in the infrared wavelength range).

In order to be able to image ever smaller structures on objects to be exposed, the optical systems of the projection exposure apparatuses must ensure a wavefront aberration which is as small as possible. At the same time, it is necessary to use comparatively large mirrors for wavelengths in the EUV region, particularly in the case of near-field mirrors. When coating large mirrors in particular, there may be layer thickness variations, which can only be compensated for poorly and can cause unwanted wavefront aberrations.

SUMMARY

It is an object of the present invention to provide a reflective optical element of an optical system for EUV lithography as well as a method of manufacturing a reflective optical element of an optical system for EUV lithography, wherein wavefront aberrations can be corrected efficiently, in particular, with as little post-processing as possible.

A method of manufacturing a reflective optical element of an optical system for EUV lithography is disclosed. The reflective optical element includes a multilayer system for reflecting an incident electromagnetic wave having an operating wavelength in the EUV range, the reflected wave having a phase $\phi$, and a capping layer made from a capping layer material, wherein the method includes:
determining, for the capping layer material, a dependency according to which the phase of the reflected wave varies with the thickness d of the capping layer;
determining a linearity-region in the dependency in which the phase of the reflected wave varies substantially linearly with the thickness of the capping layer; and
creating a thickness profile in the capping layer such that both the maximum thickness and the minimum thickness in the thickness profile are in the linearity-region.

It was found that, in the case of reflective optical elements which have a multilayer system for an operating wavelength in the extreme ultraviolet wavelength range, the phase $\phi$ of the reflected electromagnetic wave can be influenced by the thickness d of a capping layer which is applied on the vacuum side to the multilayer system. In particular, it was found that—in the characteristic dependency according to which the phase of the reflected wave varies with the thickness of the capping layer—the phase $\phi$ of the reflected wave to a first approximation changes linearly with increasing capping layer thickness in some thickness regions, while the phase of the reflected wave to a first approximation remains substantially constant in other capping layer thickness regions. It is now proposed that when designing and producing a reflective optical element, the thickness of the capping layer (which varies if a thickness profile is created in the capping layer) is selected such that it is situated in a thickness region in which the phase $\phi$ varies particularly strongly.

In embodiments of the disclosure, the "linearity-region" in the dependency "phase of reflected wave vs. thickness of capping layer" ("$\phi$ vs. d-curve") extends across an interval of values of the capping layer thickness d larger than 1 nm, particularly larger than 2 nm, more particularly larger than 4 nm. Furthermore, in embodiments of the disclosure, the "linearity-region" in the dependency "phase of reflected wave vs. thickness of capping layer" ("$\phi$ vs. d-curve") extends across an interval of values of the phase of the reflected wave larger than 0.5 nm, particular larger than 1 nm. Furthermore, in embodiments of the disclosure, the difference between the maximum thickness and the minimum thickness in the thickness profile being created in the capping layer can e.g. be at least 0.2 nm, particularly at least 0.5 nm, more particularly at least 1 nm, and more particularly at least 1.5 nm.

In the meaning of the present disclosure, the wording that in the "linearity-region" the phase of the reflected wave varies "substantially linearly" with the thickness of the capping layer is to be understood such that this linearity-region preferably also comprises regions in the dependency "phase of reflected wave vs. thickness of capping layer" ("$\phi$ vs. d-curve") in which the dependency deviates from an exact linear dependency by not more than ±15%, particularly by not more than ±10%, more particularly by not more than ±5% (referred to the respective value according to the exact linear dependency/approximation).

In the case of an individual reflective optical element, in particular if it has a relatively large lateral extent, the proposed selection of the capping layer thicknesses renders it possible that already the local removal of the smallest amounts of capping layer can correct the wavefront aberration generated there. According to an aspect of the disclosure, during the mass production of such reflective optical elements this can render the undertaking of a correction possible, despite increasing manufacturing tolerances, such that all reflective optical elements have a substantially equal resultant phase $\phi$ of the reflected electromagnetic wave at the operating wavelength.

Furthermore, the thickness of the capping layer can be specifically modified as desired in order to at least partially compensate for a wavefront aberrations being present in the remaining optical systems, or—with other words—to achieve, by introducing a thickness variation or a wavefront correction, respectively, at the surface of a specific reflective optical element, a wavefront correction of the whole optical system.

The present disclosure in particular includes the concept to provide, in a reflective optical element having a targeted thickness modification or variation of its capping layer for the purpose of at least partial compensation for wavefront aberrations being present in the remaining optical system, the capping layer in such a way that both the maximum thickness and the minimum thickness in the thickness profile being provided for said wavefront aberration compensation are between the "linearity borders" of the "$\phi$ vs. d"-curve, i.e. in the region where the phase of the wave being reflected at the element varies substantially linearly with the thickness of the capping layer.

The invention also takes into account the fact that a conventional wavefront correction approach using lenses, namely to first determine the wavefront aberration based on non-coated lens elements followed by a demounting of the non-coated lens elements, a figure correction and a layer deposition on these elements is not possible here, since non-coated mirror substrates do not exhibit a significant reflectivity for EUV-wavelengths. On the other hand, high reflecting (HR-)layers, which are time-consuming in the manufacturing process, significantly contribute, due to their lateral variations in layer thickness, to the wavefront aberrations of EUV projection objectives. It is therefore preferable to first characterize the optical system or projection objective (which already comprises all coating layers), respectively, and then to create or provide, in a selected and already existing layer of a mirror of the optical system, a corresponding correction (this concept is here and in the following also named as "ICA-process", ICA="integrated correction asphere").

The capping layer can consist of a single sub-layer made of one material or else of a sub-layer system. The capping layer particularly preferably is a sub-layer made of ruthenium. Further suitable capping layer materials include e.g. rhodium or silicon nitride. The use of ruthenium, rhodium or silicon nitride as capping layer leads not only to sufficiently extensive thickness regions of the capping layer, in which phase plateaus are formed, between which thickness regions with strongly decreasing phase $\phi$ are formed. For the multilayer system lying therebelow, these materials were moreover found to be efficient protection against oxidation by hydrogen in the residual-gas atmosphere during the EUV lithography operation or against carbon-containing contamination.

According to an embodiment, creating a thickness profile in the capping layer is performed such that a wavefront aberration in the optical system is at least partially compensated by the reflective optical element.

According to another embodiment, creating a thickness profile in the capping layer is performed such that the variation in the phase $\phi$ relative to the variation in the capping layer thickness d is greater than 25%, in particular greater than 35%, more particularly, greater than 40%. What this renders possible is that, even in the case of relatively large wavefront aberrations, a correction can already be carried out by removing small amounts of capping layer.

According to another embodiment, the dependency, according to which the phase of the reflected wave varies with the thickness of the capping layer, is such that the phase $\phi$ initially remains substantially constant in the dependency until a thickness d1 is reached, decreases between the thickness d1 and a further thickness d2, with d1<d2, and remains substantially constant at a thickness greater than d2, wherein the step of creating a thickness profile in the capping layer is performed such that the resulting thicknesses d of the capping layer meet the condition d1<d<d2.

According to a further embodiment, the method further includes:
determining, for the capping layer material, a dependency according to which the reflectivity of the reflective optical element varies with the thickness of the capping layer; and
determining a plateau-region in the dependency in which the reflectivity of the reflective optical element is substantially constant.
Creating the thickness profile in the capping layer is performed such that both the maximum thickness and the minimum thickness in the thickness profile are in the plateau-region.

The invention also relates to a method of manufacturing a reflective optical element of an optical system for EUV lithography, the reflective optical element having a multilayer system for reflecting an incident electromagnetic wave with an operating wavelength in the EUV range, and a capping layer made from a capping layer material, wherein the method includes:
determining, for the capping layer material, a dependency according to which the reflectivity of the reflective optical element varies with the thickness of the capping layer;
determining a plateau-region in the dependency in which the reflectivity of the reflective optical element is substantially constant; and creating a thickness profile in the capping layer such that both the maximum thickness and the minimum thickness in the thickness profile are in the plateau-region.

Due to the fact that the reflectivity of the EUV high reflecting (HR-)layers critically depend on the thickness of a cap layer e.g. made from ruthenium (Ru), a thickness variation due to the ICA-correction will result in a reflectivity variation of the respective mirror which can amount to several percent. Based on these considerations, the disclosure also addresses adapting the layer thickness of the cap layer such that the reflectivity remains substantially constant over the whole region of thickness values that may be obtained in the ICA-correction process. Here, a reduction of the absolute value of reflectivity across the mirror may be deliberately accepted.

According to an embodiment, creating a thickness profile in capping layer is performed such that both the maximum thickness and the minimum thickness in the thickness profile are in the region from 1 nm to 4 nm.

According to a further embodiment, the capping layer material comprises ruthenium, rhodium or silicon nitride.

According to another embodiment, the multilayer system has alternately arranged sub-layers made of silicon and molybdenum.

The invention also relates to a reflective optical element for EUV lithography, characterized in that it is manufactured using a method as described above.

The invention also relates to a reflective optical element for EUV lithography, comprising:
a multilayer system for reflecting an incident electromagnetic wave having an operating wavelength in the EUV range; and
a capping layer made from a capping layer material;
wherein the capping layer has a variation in the capping layer thickness such that the variation in the phase $\phi$ relative to the variation in the capping layer thickness is greater than 25%.

According to an embodiment, the capping layer has a variation in the capping layer thickness such that the variation in the phase $\phi$ relative to the variation in the capping layer thickness is greater than 35%, more particularly, greater than 40%.

The invention also relates to an optical system for EUV lithography, comprising a reflective optical element as described above.

According to an embodiment, the optical system is embodied as a projection system. Good imaging qualities, with which the structures on a mask or a reticle are imaged on an object to be exposed, for example on a wafer, are important, particularly in projection systems in an EUV lithography device. As a result of using at least one optical element as described above, a high imaging quality can be ensured.

According to yet another embodiment, the reflective optical element is arranged in a plane of the optical system in which a parameter P(M) which is defined as $$P(M) = \frac{D(SA)}{D(SA) + D(CR)},$$

is less than 0.2, in particular less than 0.1, wherein D(SA) denotes the subaperture diameter and D(CR) denotes the maximum principal ray spacing defined over all field points of the optically used field on the optical surface M in the plane in question. The parameter P(M) is also further discussed below. According to the above criterion, the reflective optical element is arranged close to a field plane of the optical system. It was found to be advantageous if the reflective optical element has a near-field arrangement in the optical system, particularly in a projection system. In the case of near-field optical elements, variations in the wavefront reflected thereon have a particularly strong effect.

The capping layer thickness d particularly preferably lies in the range between approximately 1 nm and 10 nm, more particularly in the range from 1 nm to 4 nm. In this range, a region with strongly decreasing phase $\phi$ can be formed between two phase plateaus, depending on the capping layer thickness. At the same time, the capping layer thickness is preferably sufficiently small so as not to have to accept excessively large drops in the reflectivity of the reflective optical element due to absorption in the capping layer.

In certain embodiments, the dependency according to which the phase of the reflected wave varies with the thickness of the capping layer, is such that the phase $\phi$ initially remains substantially constant the dependency until a thickness d1 is reached, decreases between the thickness d1 and a further thickness d2, with d1<d2, and remains substantially constant at a thickness greater than d2, wherein the thickness d of the capping layer (which varies if a thickness profile is created in the capping layer) is selected such that it lies in the range between (d1+d2)/2 and d2. The thickness d can particularly lie between (d1+3*d2)/4 and d2. As a result of this, it becomes possible for even relatively large wavefront aberrations, in which a relatively large portion of capping layer has to be ablated subsequently, for example with the aid of an ion beam, to be able to be corrected.

The multilayer system advantageously has alternately arranged sub-layers made of silicon and molybdenum. Multilayer systems based on silicon and molybdenum are particularly suitable for operating wavelengths in the range between 12.5 nm and 15 nm.

In certain embodiments, the thickness of the sub-layer of the multilayer system adjoining the capping layer is selected such that the reflectivity varies by less than 10%, particularly less than 5%, more particularly preferably less than 1%, over a region of values of the capping layer thickness d that is as large as possible, in particular over an interval of values of the capping layer thickness d larger than 1 nm, particularly larger than 2 nm, more particularly larger than 4 nm. In particular, what is considered is the relative variation in the reflectivity compared to the maximum reflectivity that can be achieved in the relevant region. This selection of the sub-layer thickness reduces the risk of having to accept variations in the reflectivity which are too large when carrying out corrections of wavefront aberrations by virtue of removing capping layer. Optionally, it is also possible for more than one sub-layer of the multilayer system to be varied in terms of the thickness thereof or this variation can be applied to the sub-layer lying below the sub-layer adjoining the capping layer or to an even deeper lying sub-layer in place of said sub-layer adjoining the capping layer. This likewise applies to the reflective optical elements referred to above.

Further configurations of the invention can be gathered from the description and from the dependent claims. The invention is explained in greater detail below on the basis of exemplary embodiments illustrated in the accompanying drawings.

BRIEF DESCRIPTION OF THE DRAWINGS

FIGS. 3A-3C schematically show the design of a reflective optical element;

FIGS. 7A-7C show schematic illustrations to explain a concept of creating a thickness profile in the capping layer in consideration of the standing wave field created by the multilayer system in the reflective optical element.

DETAILED DESCRIPTION OF THE DRAWINGS

Figure 1:
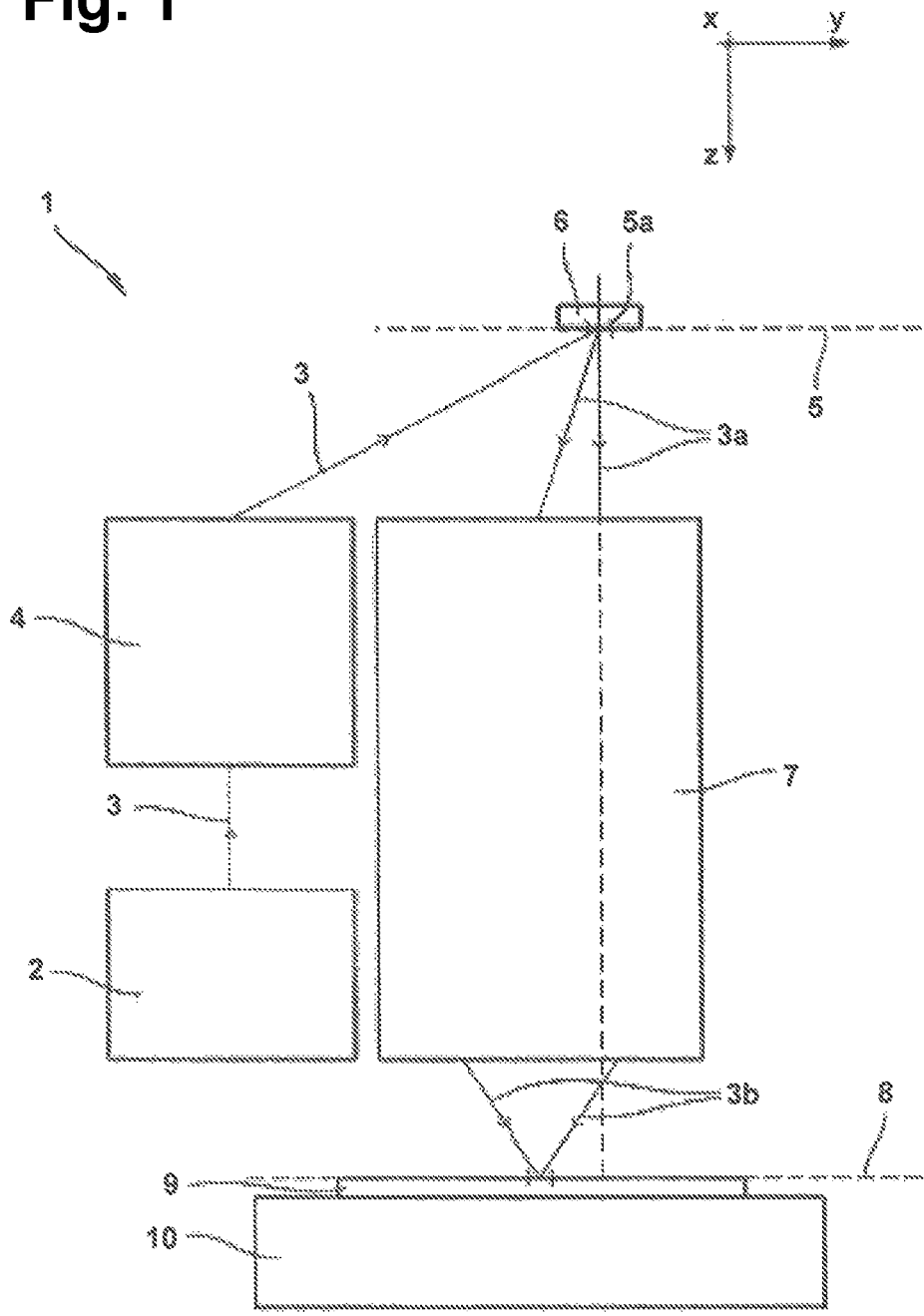
FIG. 1 shows a schematic depiction of an EUV lithography device.

FIG. 1 depicts, in an exemplary and very schematic manner, a lithographic projection exposure apparatus 1 with UV or EUV radiation. The projection exposure apparatus 1 has a light source 2. Illumination light 3 emerges from the light source, with the illumination light 3 being guided to an object field 5a in an object plane 5 using an illumination system 4 with optical elements not depicted here. Arranged in the object plane 5 is a reticle 6 having a structure which, as image field, should be imaged on an object 9 arranged in the image plane 8. In the example depicted here, the object 9 to be exposed is a wafer which is held in the image plane 8 with the aid of an object holder 10. The object field in the object plane 5 is imaged on the wafer 9 in the image plane 8 using the projection system 7. To this end, a beam 3a emanating from the object plane 5 enters the projection system 7 and, as a beam 3b emerging from the projection system 7, impinges on the wafer 9 in the image plane with the desired linear magnification. The projection exposure apparatus 1 is a scanner-type apparatus. Both the reticle 6 and the object 9 are scanned in the y-direction during the operation of the projection exposure apparatus 1.

Both one or else more mirrors of the illumination system 4 and, in particular, of the projection system 7 and also the reticle 6 can be a reflective optical element for an operating wavelength in the ultraviolet to extreme ultraviolet wavelength range. Here, this can be a reflective optical element for EUV lithography, comprising a multilayer system for an operating wavelength in the extreme ultraviolet wavelength range, at which an incident electromagnetic wave at the operating wavelength can be reflected, the reflected wave having a phase φ, and a capping layer with a thickness d, with the phase φ varying depending on the thickness d, in which the phase variation relative to the capping layer thickness variation is greater than 25%, preferably greater than 40%. Alternatively, this can also be a reflective optical element for EUV lithography, comprising a multilayer system for an operating wavelength in the extreme ultraviolet wavelength range, at which an incident electromagnetic wave at the operating wavelength can be reflected, the reflected wave having a phase φ, and a capping layer with a thickness d, with the phase φ varying depending on the thickness d in such a way that the phase φ initially remains substantially constant until a thickness d1 is reached, decreases between the thickness d1 and a further thickness d2, with d1<d2, and remains substantially constant at a thickness greater than d2, in which the thickness d is selected in such a way that d1<d<d2.

Figure 2:
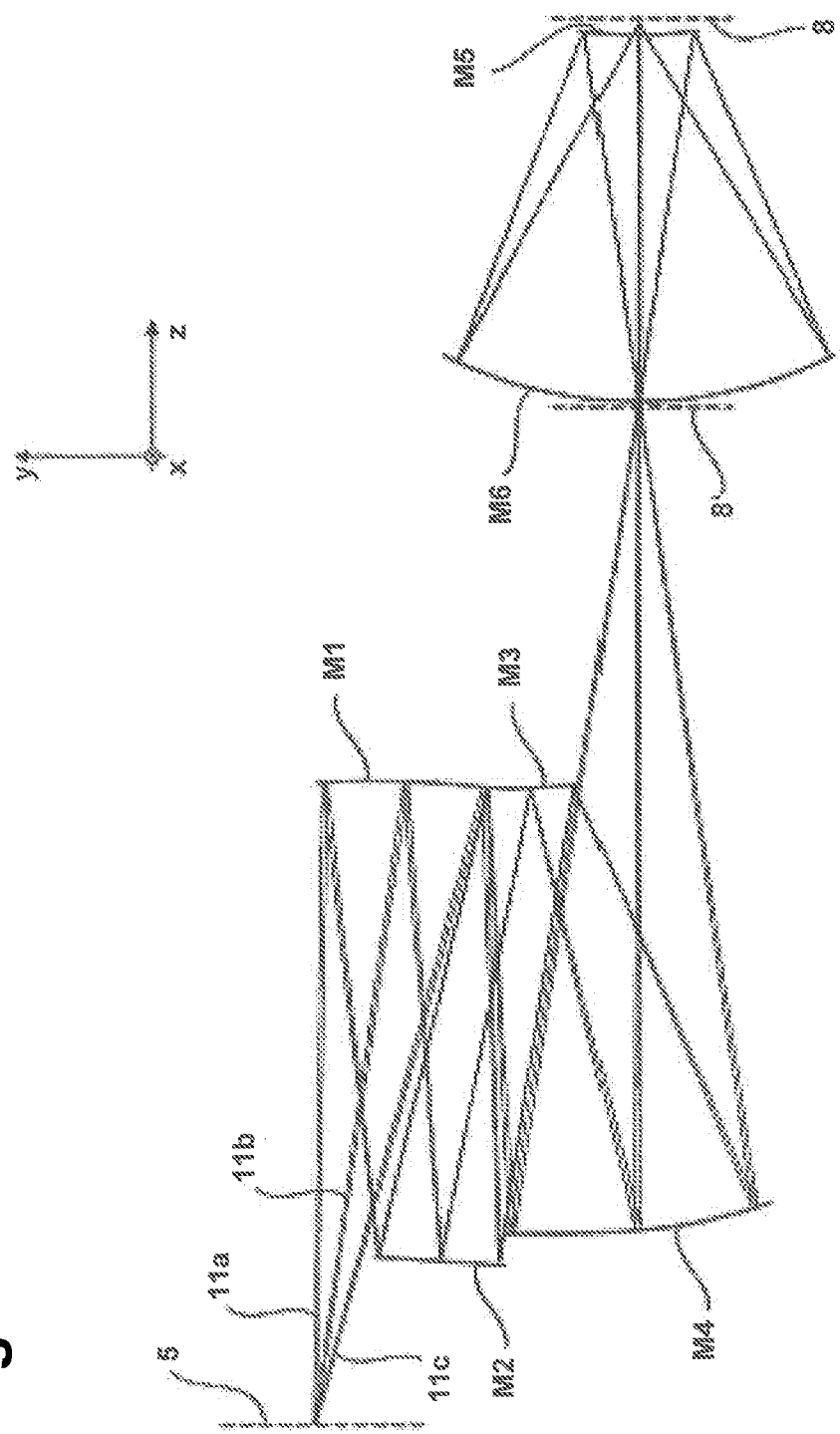
FIG. 2 shows a schematic depiction of one embodiment of a projection system of a lithography device as in FIG. 1.

FIG. 2 depicts, in an exemplary and schematic manner, an embodiment of the projection system 7 from FIG. 1, which has six mirrors M1 to M6. Depending on the projection system, that can also be more or less than six mirrors. Depicted in FIG. 2 is the beam path of a central sub-beam 11b and two sub-beams 11a,c at the edge of an overall beam, which emanate from the object field in the object plane 5 and are imaged in the image field in the image plane 8 by means of the six mirrors M1 to M6.

The mirrors M1 to M4 image the object plane 5 in an intermediate image plane 8'. The sub-beams 11a-c cross at one point in the intermediate plane 8'.

The pupil or field nearness of an optical element such as the mirror M6 respectively can be quantitatively described by way of a parameter P(M) (as described for example in US 2008/0165415 A1), wherein the parameter P(M) is defined as:

$$P(M) = \frac{D(SA)}{D(SA) + D(CR)}, \tag{1}$$

wherein D(SA) denotes the subaperture diameter and D(CR) denotes the maximum principal ray spacing (from all field points or defined over all field points of the optically used field) on the optical surface M in the plane in question. Thus P(M)=0 applies for a field mirror (with a subaperture diameter of zero) and P(M)=1 for a pupil mirror (with a principal ray spacing of zero). If the respective optical element is arranged exactly in the pupil plane, D(CR) equals 0 by definition. The value of the parameter P then equals 1. Accordingly, an optical element is arranged in the proximity of a pupil plane if P has a value close to 1. In the case where the respective optical element is arranged in a field plane, D(SA) equals 0 since the beam emanating from the field point of the object plane 5 collapses to a point at said location. The value of the parameter P then likewise is 0. Accordingly, an optical element is arranged in the proximity of a field plane if P has a value close to 0. This concept of the term pupil proximity or pupil distance is also explained in more detail in EP 1 930 771 A1 in conjunction with FIG. 4 therein.

Arranged centered in a pupil plane of FIG. 2 is an obscuration stop (not depicted). Using this, the sub-beams assigned to the central through-holes in the mirrors M5, M6 are obscured. The mirror M6, which together with the mirror M5 images the intermediate image field in the intermediate image plane 8' in the image plane 8, is arranged in the proximity of a further pupil plane. The embodiment of the projection system depicted in FIG. 2 is a system with central pupil obscuration.

Each of the mirrors M1 to M6 can be one of the reflective optical elements described herein. In the example depicted in FIG. 2, it is possible to achieve an increase in reflectivity by adapting the arrangement of portions of the multilayer system with only one or more than one period thickness to the distribution of the angle of incidence bandwidths on the respective mirror, in particular in mirror M5, which, in the example depicted here, is the mirror with the largest angle of incidence bandwidths.

FIG. 3A-C schematically depict the design of a reflective optical element 20. Applied to a substrate 22 is a multilayer system 23, which substantially forms the reflective surface 21 (see FIG. 3A). FIG. 3B schematically shows the overarching structure of the multilayer system 23. In the present example, the multilayer system 23 was produced by successive coating of a substrate 22 with different materials with different complex refractive indices. Moreover, a capping layer 25, which can be made of several different material sub-layers, for protection against external influences such as e.g. contamination was additionally applied to the multilayer system 23. The thickness of the capping layer 25 can preferably be selected in such a way that, in the case of variations about this thickness, the variation in the phase $\phi$ of the wave reflected at the reflective optical element 20 is as high as possible, in particular greater than 25%, preferably greater than 40%, relative to the variation in the thickness of the capping layer 25.

The multilayer system 23 substantially consists of multiply repeating stacks 24, the structure of which is depicted schematically in FIG. 3C for a preferred embodiment and the thickness of which is also referred to as period thickness. The substantial sub-layers of a stack 24, which, in particular, by the multiple repetition of the stack 24, lead to sufficiently high reflection at an operating wavelength, are the so-called spacer sub-layers 26 made of a material with a higher real part of the refractive index and the so-called absorber sub-layers 27 made of a material with a lower real part of the refractive index. As a result of this, a crystal is simulated in a certain way, with the absorber sub-layers 27 corresponding to the lattice planes within the crystal, which have a distance from one another defined by the respective spacer sub-layers 26 and at which reflection of incident ultraviolet or, in particular, extreme ultraviolet radiation occurs. The thicknesses of the sub-layers are selected in such a way that, at a specific operating wavelength, the radiation reflected at each absorber sub-layer 27 interferes constructively in order thereby to achieve a high reflectivity of the reflective optical element. In so doing, the reflectivity obeys the Bragg condition and is therefore dependent not only on the wavelength but also on the angle of incidence.

In EUV lithography, work is preferably done at e.g. wavelengths between 12 nm and 15 nm. In this wavelength range, it is possible to obtain particularly high reflectivities using multilayer systems on the basis of molybdenum as absorber material and silicon as spacer material. By way of example, at a wavelength of 13.5 nm, reflectivities in the region of up to 75% are theoretically possible. In so doing, use can be made, for example, of 50 to 60 stacks with a thickness of approximately 7 nm and a ratio of absorber sub-layer thickness to stack thickness of approximately 0.4. However, in the case of real molybdenum/silicon multilayer systems, a mixed layer of molybdenum silicide is formed at the sub-layer boundaries and this leads to a significant reduction in the maximum achievable reflectivity. In order to counteract the deterioration of the optical properties, it is optionally proposed, in accordance with the example depicted in FIG. 3C, to provide an intermediate sub-layer 28 both at the interfaces from spacer 26 to absorber 27 and at the interfaces from absorber 27 to spacer 26, in order to increase the thermodynamic and thermal stability of the multilayer system.

Reference is made to the fact that the thicknesses of the individual sub-layers 26, 27, 28 and also of the repeating stacks 24, i.e. the period thicknesses, can be constant over the entire multilayer system or else can vary, depending on what reflection profile is intended to be achieved. In particular, multilayer systems can be optimized for specific wavelengths, at which the maximum reflectivity and/or the reflected bandwidth is greater than at other wavelengths. In the case of radiation at this wavelength, the corresponding reflective optical element 20 is used, e.g. in EUV lithography, which is why this wavelength, for which the reflective optical element 20 was optimized, is also referred to as operating wavelength. As a result of the appropriate selection of the alternating materials and the layer thicknesses, multilayer systems can also be designed for other wavelengths up into the x-ray range or into the UV range.

Figure 4A:
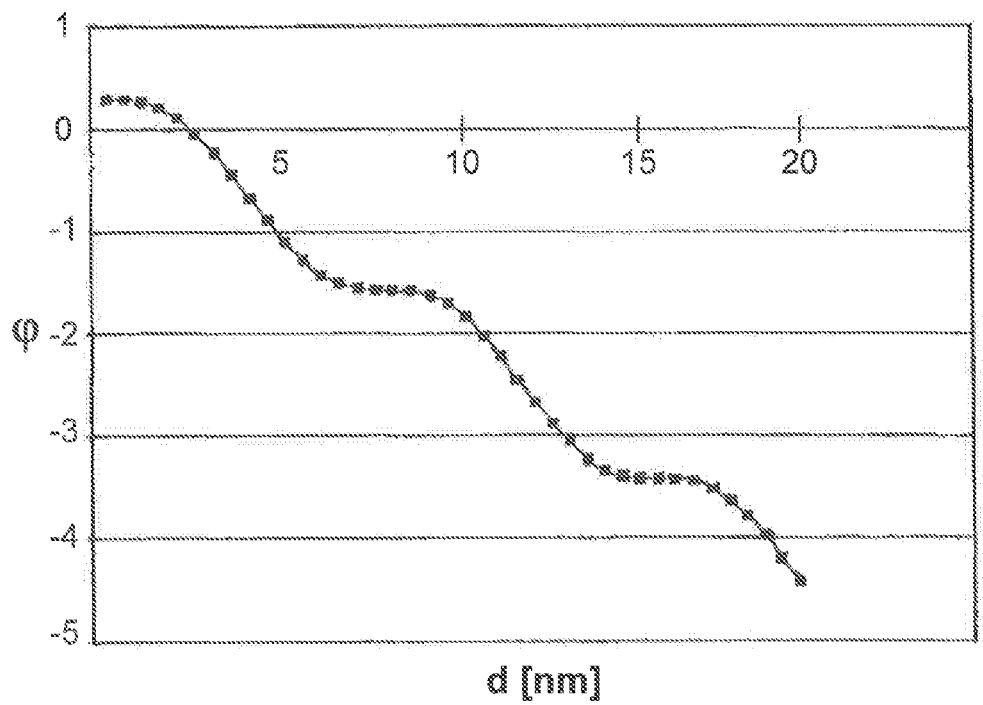
FIGS. 4A-4B show the dependence of the phase φ of a reflected electromagnetic wave at the operating wavelength depending on the capping layer thickness d for a reflective optical element.
Figure 4B:
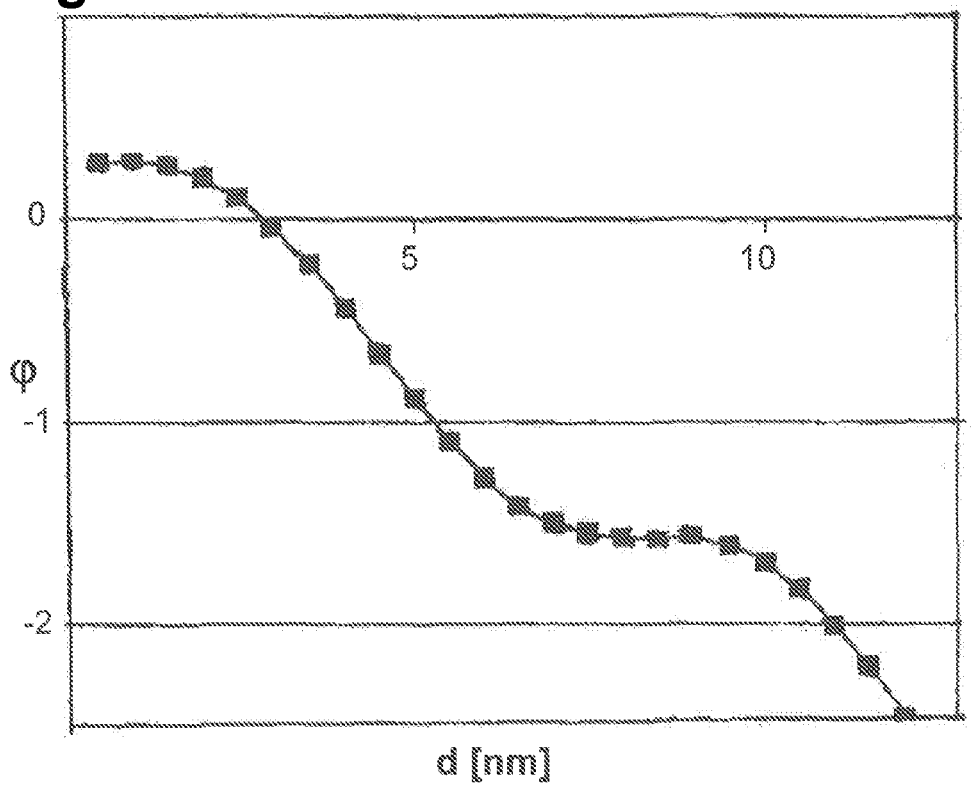

FIGS. 4A and 4bB show the dependence of the phase $\phi$ of a reflected electromagnetic wave on the capping layer thickness d. In the present example, the reflective optical element is a standard multilayer system on the basis of alternately arranged sub-layers made of molybdenum as absorber and silicon as spacer, designed for an operating wavelength of 13.5 nm. The reflective optical element has a capping layer made of ruthenium with a thickness d. For this reflective optical element, the behavior of the phase $\phi$ of the electromagnetic wave, reflected at the optical element, with a wavelength of 13.5 nm compared to the incident electromagnetic wave was examined for various capping layer thicknesses of ruthenium between 0.5 nm and 21 nm. This phase difference is specified in units of nanometer (nm). In so doing, the fact that the reflected wave is a superposition of the partial waves reflected at different sub-layers of the multilayer system and the fact that absorption takes place both within the multilayer system and also within the capping layer were taken into account.

FIG. 4A depicts the whole thickness range from 0.5 nm to 21 nm. FIG. 4B depicts, in slightly magnified fashion, the thickness range from 0.5 nm to 12 nm. Plateaus are formed in the thickness ranges 0.5 to 2.0 nm, 6.5 to 9.5 nm and 15.0 to 17.5 nm, in which the phase $\phi$ is dependent only to a very small extent on the changing capping layer thickness d and can be considered to be substantially constant. In the remaining thickness ranges, the phase $\phi$ to a first approximation changes linearly with the increasing capping layer thickness d. In particular, in the region between the plateaus, the variation in the phase $\phi$ is greater than 25% of the change in the capping layer thickness. Thus, the phase difference in the thickness range from 2.0 nm to 6.5 nm changes from approximately 0.1 nm to approximately 1.5 nm, i.e. by more than 35%. In the thickness range from 10 nm to 14.5 nm, the phase difference changes by approximately 1.4 nm, i.e. by more than 32%. In the case of a different selection of the capping layer material and of the design not only as a single sub-layered capping layer, but also as a multilayered capping layer, it is also possible to achieve a ratio of more than 40%.

In order now to correct the wavefront aberration as desired or in order to at least partially compensate for a wavefront aberrations being present in the remaining optical systems (i.e. to achieve a wavefront correction of the whole optical system) by removing as little capping layer as possible in the case of a reflective optical element for EUV lithography, the capping layer thickness d should be selected during the production thereof in such a way that it is situated between two plateau-like thickness regions. The capping layer thickness is preferably selected in such a way that it is closer to the upper edge of the respective thickness value range from d1 to d2 in order, where necessary, also to be able to correct relatively large wavefront aberrations. Here, to a first approximation, the assumption is made that the contamination layer does not substantially change the approximate profile of the relationship between the phase $\phi$ and the capping layer thickness d depicted in FIGS. 4A and B. In preferred embodiments, the thickness d of the capping layer is selected in such a way that it lies in the range between (d1+d2)/2 and d2; the thickness d is particularly preferably selected in such a way that it lies between (d1+3*d2)/4 and d2.

Figure 5:
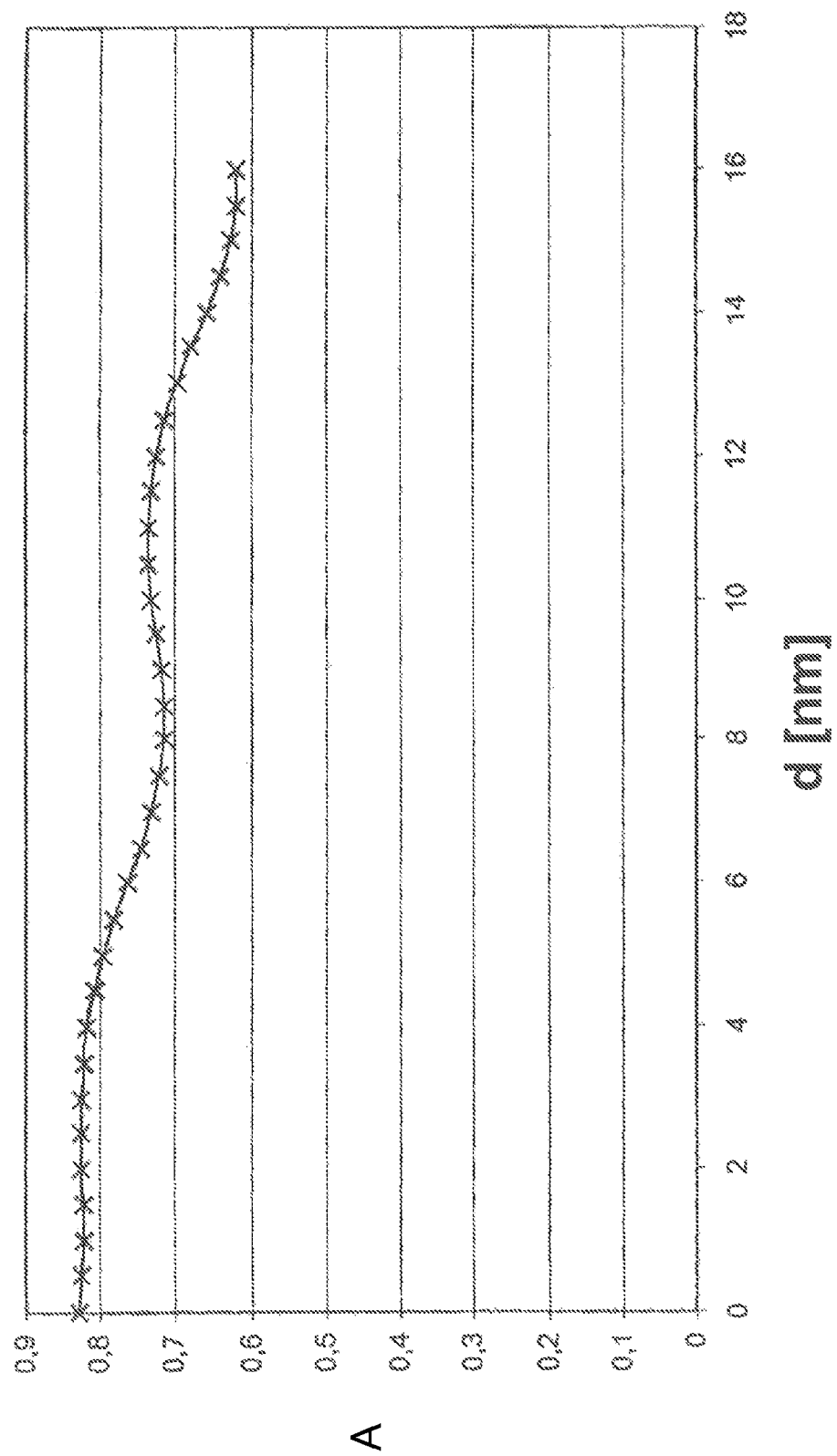
FIG. 5 shows the dependence of the amplitude of the reflected waves depending on the capping layer thickness d.

FIG. 5 shows the amplitude A of the reflected wave depending on the thickness of the capping layer for the reflective optical element from FIG. 4A,B and, in this case too, the fact that this is a superposition of individual partial waves and the fact that absorption takes place both within the multilayer system and in the capping layer were taken into account. In the thickness range between 2 nm and 6 nm, the amplitude A drops from a value of more than 0.8 to slightly above 0.7. The reflectivity of the reflective optical element is calculated from the square of the amplitude A.

Taking into account the fact that the reflective optical elements within an EUV lithography device in each case should have a reflectivity that is as high as possible, the thickness range between 2 nm and 6 nm is preferred for the capping layer compared to the thickness between 10 nm and 15 nm. This is because significant drops in reflectivity are to be expected in the higher capping layer thickness range compared to the range between 2 nm and 6 nm.

Figure 6A:
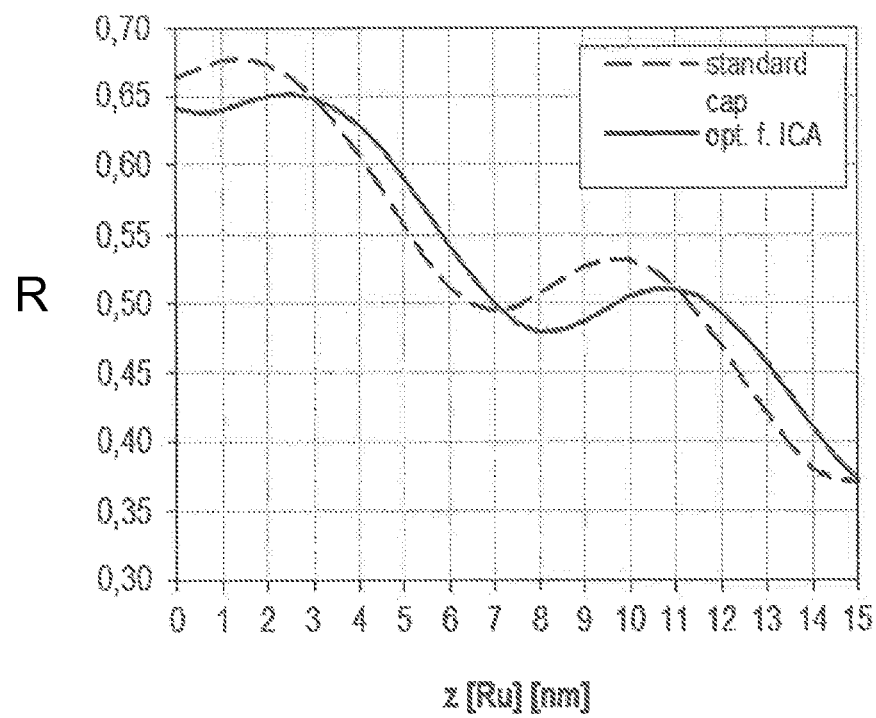
FIGS. 6A-6B show the dependence of the reflectivity on the capping layer thickness d for a reflective optical element with an adapted multilayer system.
Figure 6B:
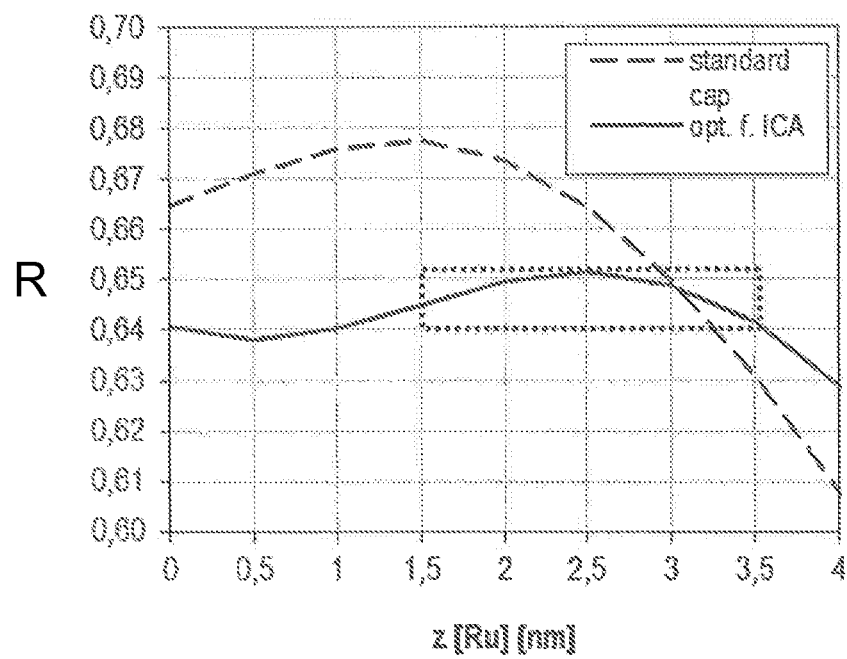

FIG. 6A,B depict the dependence of the reflectivity over a capping layer thickness range from 0 nm to 15 nm (FIG. 6A) and from 0 to 4 nm (FIG. 6B) for two different reflective optical elements. The dashed curve in FIG. 6A,B corresponds to the reflective optical element from FIGS. 4A,B and 5. In contrast to this, the uppermost silicon sub-layer of the multilayer system was selected to be thinner by half in the reflective optical element corresponding to the solid curve in FIG. 6A,B. As a result of this, the position of the reflectivity plateau shifts to higher capping layer thicknesses. As a result, the variation in the reflectivity in the range from 1 nm to 3 nm relative to the maximum reflectivity achievable in this range is less than 1.6%, i.e. significantly less than 10%, for the reflective optical element in accordance with the solid curve in FIG. 6A,B. Hence, by adapting the thickness of a sub-layer of the multilayer system, regions appear with at the same time good options for correcting the wavefront aberrations by removing capping layer and sufficient and relatively constant reflectivity, with this effect being ever more pronounced, the closer the sub-layer(s), the thickness(es) of which is/are selected to be different compared to the conventional multilayer system, lie(s) to the capping layer. In the variant described here, where the uppermost sub-layer of the multilayer system is selected with a different thickness, it is also possible to consider this sub-layer as belonging to a capping layer containing two sub-layers. This would correspond to a capping layer thickness range from approximately 3.1 nm to 5.1 nm. An analog statement also applies if the uppermost-but-one sub-layer of the multilayer system is selected to have a different thickness, etc. In preferred embodiments, the thickness d of the capping layer is selected in such a way that it lies in the range between (d1+d2)/2 and d2; the thickness d is particularly preferably selected in such a way that it lies between (d1+3*d2)/4 and d2. The position and extent of the plateaus and the steep region in the phase difference profile can also be influenced in a targeted manner by the selection of the material or materials in the capping layer.

FIG. 7A-C show schematic illustrations to explain a concept of creating a thickness profile in the capping layer in consideration of the standing wave field.

FIG. 7A shows a standard capping layer 75 (which can e.g. be made of Ruthenium (Ru) and may have a thickness of e.g. 1.5 nm to 2 nm) deposited on a diffusion-barrier layer 78 as well as a multilayer system 73 of Mo-layers and Si-layers on a substrate 72. As also shown in FIG. 7A, the layer stack is optimized in such a way that the standing wave field created by the multilayer system 73 has a maximum (denoted as "A" in FIG. 7A-C) just at the (vacuum) interface to the capping layer 75. As also illustrated in FIG. 7A, the thickness of the last silicon layer 74 in the multilayer system 73 (in direction to the capping layer 75) is adapted in such a way a maximum in reflectivity is achieved.

FIGS. 7B and 7C serve to illustrate the creation of a thickness profile in the capping layer (using an IBF-process, IBF="ion beam figuring") in order to obtain a desired wavefront correction in the optical system, where analogous components compared to FIG. 7A are designated with reference signs that are larger by "10". According to FIG. 7B, the capping layer 85 is initially enhanced in order to still provide, after the creation of a thickness profile as shown in FIG. 7C, the minimum required thickness of the capping layer 85. Furthermore, in order to obtain the before-described plateau-region in the dependency of the reflectivity vs. capping layer thickness, the thicknesses of the last silicon layer 84 in the multilayer system 83 and of the capping layer 85 are selected such that, in average, the (vacuum) interface to the capping layer 85 is at the same position where it would be for the "standard cap" of FIG. 7A, i.e. such that the standing wave field created by the multilayer system 83 has a maximum (denoted as "A") just at this vacuum interface.

Even though the invention has been described on the basis of specific embodiments, numerous variations and alternative embodiments are evident to the person skilled in the art, e.g. by combination and/or exchange of features of individual embodiments. Accordingly, such variations and alternative embodiments are concomitantly encompassed by the present invention, and the scope of the invention is restricted only within the meaning of the accompanying patent claims and the equivalents thereof.

What is claimed is:

1. A method of manufacturing a reflective optical element of an optical system for extreme ultraviolet (EUV) lithography, wherein the reflective optical element comprises a multilayer system configured to reflect an incident electromagnetic wave having an operating wavelength in the EUV range, the reflected wave having a phase $\phi$, and a capping layer made from a capping layer material and having a thickness d, wherein the method comprises:
   determining, for the capping layer material, a dependency according to which the phase $\phi$ of the reflected wave varies with the thickness d of the capping layer;
   determining a linearity-region in the dependency in which the phase of the reflected wave varies substantially linearly with the thickness of the capping layer; and
   creating a thickness profile in the capping layer such that both a maximum value of the thickness and a minimum value of the thickness in the thickness profile are in the linearity-region.

2. The method according to claim 1, wherein creating the thickness profile in the capping layer is performed such that a wavefront aberration in the optical system is at least partially compensated by the reflective optical element.

3. The method according to claim 1, wherein creating the thickness profile in the capping layer is performed such that the variation in the phase $\phi$ relative to the variation in the capping layer thickness d is greater than 25%.

4. The method according to claim 1, wherein the dependency, according to which the phase of the reflected wave varies with the thickness of the capping layer, is such that the phase $\phi$ initially remains substantially constant in the dependency until a thickness d1 is reached, decreases between the thickness d1 and a further thickness d2, with d1<d2, and remains substantially constant at a thickness greater than d2, wherein creating the thickness profile in the capping layer is performed such that the thicknesses d of the capping layer resulting from the dependency meet the condition d1<d<d2.

5. The method according to claim 1, further comprising:
   determining, for the capping layer material, a dependency according to which the reflectivity of the reflective optical element varies with the thickness of the capping layer; and
   determining a plateau-region in the dependency in which the reflectivity of the reflective optical element is substantially constant;
   wherein creating a thickness profile in the capping layer is performed such that both the maximum thickness and the minimum thickness in the thickness profile are located in the plateau-region.

6. A method of manufacturing a reflective optical element of an optical system for extreme ultraviolet (EUV) lithography, wherein the reflective optical element comprises a multilayer system configured to reflect an incident electromagnetic wave having an operating wavelength in the EUV range, and a capping layer made from a capping layer material, wherein the method comprises:
   determining, for the capping layer material, a dependency according to which the reflectivity of the reflective optical element varies with the thickness of the capping layer;
   determining a plateau-region in the dependency in which the reflectivity of the reflective optical element is substantially constant; and
   creating a thickness profile in the capping layer such that both the maximum thickness and the minimum thickness in the thickness profile are located in the plateau-region.

7. The method according to claim 6, wherein creating the thickness profile in the capping layer is performed such that both the maximum thickness and the minimum thickness in the thickness profile are between 1 nm and 4 nm.

8. The method according to claim 6, wherein the capping layer material comprises ruthenium, rhodium or silicon nitride.

9. The method according to claim 6, wherein the multilayer system comprises alternately arranged sub-layers made of silicon and molybdenum.

10. The method according to claim 3, wherein creating the thickness profile in the capping layer is performed such that the variation in the phase φ relative to the variation in the capping layer thickness d is greater than 35%.

11. The method according to claim 6, wherein creating the thickness profile in the capping layer is performed such that the variation in the phase φ relative to the variation in the capping layer thickness d is greater than 40%.

12. Reflective optical element for extreme ultraviolet (EUV) lithography, comprising:
   a multilayer system configured to reflect an incident electromagnetic wave having an operating wavelength in the EUV range, the reflected wave having a phase φ; and
   a capping layer made from a capping layer material and having a thickness d;
   wherein the capping layer has a variation in the capping layer thickness d such that the variation in the phase φ relative to the variation in the capping layer thickness is greater than 25%.

13. Reflective optical element according to claim 12, wherein the capping layer thickness varies such that the variation in the phase φ relative to the variation in the capping layer thickness d is greater than 35%.

14. Reflective optical element according to claim 13, wherein the capping layer thickness varies such that the variation in the phase φ relative to the variation in the capping layer thickness d is greater than 40%.

15. Optical system for EUV lithography, comprising a reflective optical element according to claim 12.

16. Optical system according to claim 15, embodied as a projection system.

17. Optical system according to claim 15, wherein the reflective optical element is arranged in a given plane of the optical system in which a parameter P(M), which is defined as $$P(M) = \frac{D(SA)}{D(SA) + D(CR)},$$

is less than 0.2, wherein D(SA) denotes a subaperture diameter and D(CR) denotes a maximum principal ray spacing defined over all field points of the optically used field on the optical surface M in the given plane.

18. Optical system according to claim 17, wherein P(M) is less than 0.1.

* * * * *

UNITED STATES PATENT AND TRADEMARK OFFICE
CERTIFICATE OF CORRECTION

PATENT NO. : 9,606,446 B2  
APPLICATION NO. : 14/732248  
DATED : March 28, 2017  
INVENTOR(S) : Wabra et al.

Page 1 of 1

It is certified that error appears in the above-identified patent and that said Letters Patent is hereby corrected as shown below:

In the Specification

Column 10, Line 6, replace "4bB" with --4B--

Signed and Sealed this
Twenty-first Day of May, 2019

Andrei Iancu
*Director of the United States Patent and Trademark Office*